United States Patent
Tanaka

Patent Number: 6,069,418
Date of Patent: May 30, 2000

[54] ELECTROMAGNETIC MOTOR

[75] Inventor: Keiichi Tanaka, Funabashi, Japan

[73] Assignee: Nikon Corporation, Tokyo, Japan

[21] Appl. No.: 09/159,459

[22] Filed: Sep. 24, 1998

[30] Foreign Application Priority Data

Sep. 25, 1997 [JP] Japan ................................. 9-278171
Aug. 14, 1998 [JP] Japan ............................... 10-229739

[51] Int. Cl.[7] ............................................. H02K 41/00
[52] U.S. Cl. ............................... 310/12; 29/760; 33/1 M; 74/471 XY
[58] Field of Search ................. 310/12, 13, 14; 33/1 M; 74/471; 108/137, 138; 29/721, 760, 785

[56] References Cited

U.S. PATENT DOCUMENTS

| | | | |
|---|---|---|---|
| 4,535,278 | 8/1985 | Asakawa | 318/687 |
| 4,908,533 | 3/1990 | Karita et al. | 310/12 |
| 5,334,892 | 8/1994 | Chitayat | 310/12 |
| 5,723,917 | 3/1998 | Chitayat | 310/12 |

FOREIGN PATENT DOCUMENTS

| | | |
|---|---|---|
| 8-63231 | 3/1996 | Japan . |
| 2 290 658 | 1/1996 | United Kingdom . |

*Primary Examiner*—Nestor Ramirez
*Assistant Examiner*—Judson H. Jones
*Attorney, Agent, or Firm*—Oliff & Berridge, PLC

[57] ABSTRACT

An electromagnetic motor generates thrust using Lorentz's forces, and is capable of providing a high thrust and high efficiency by generating high magnetic density, and does not affect magnets with a demagnetization field, thus preventing burning of the magnets. The electromagnetic motor includes a plurality of magnets in which same poles of adjacent magnets are opposed to each other. The plurality of magnets are aligned in one direction at a specified pitch P. A pole unit has a plurality of yokes that are interposed between the plurality of magnets and aligned in one direction with the pitch P. Armature coils are opposed to and spaced from the pole unit, and are surrounded by a space equal to the pitch P. A thrust generator has cores that anchor the armature coils so that they are aligned in one direction.

34 Claims, 9 Drawing Sheets

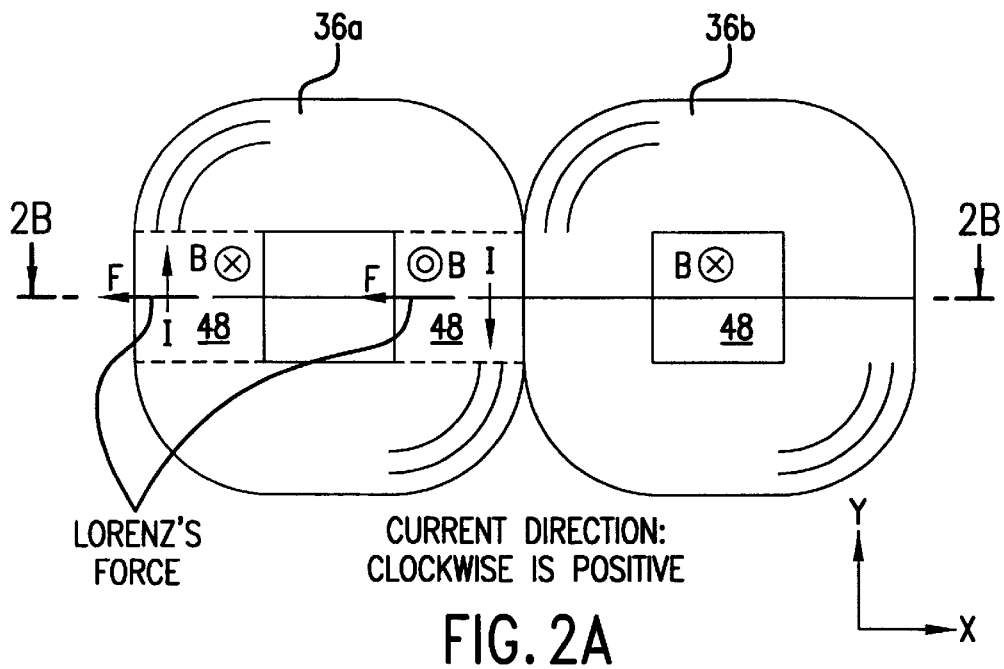
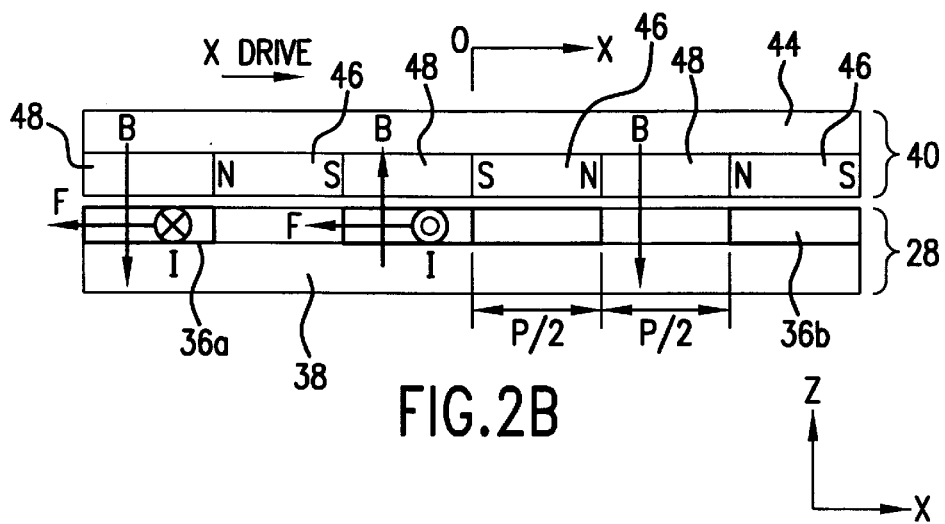
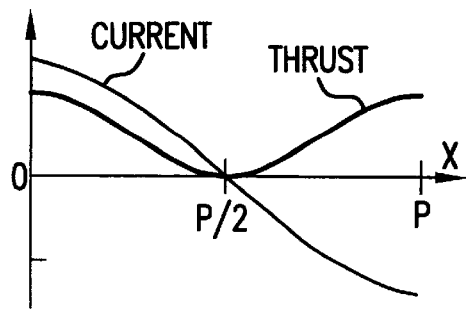
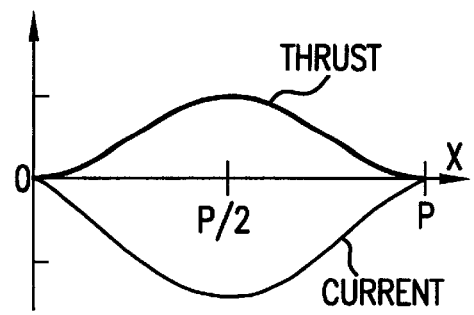

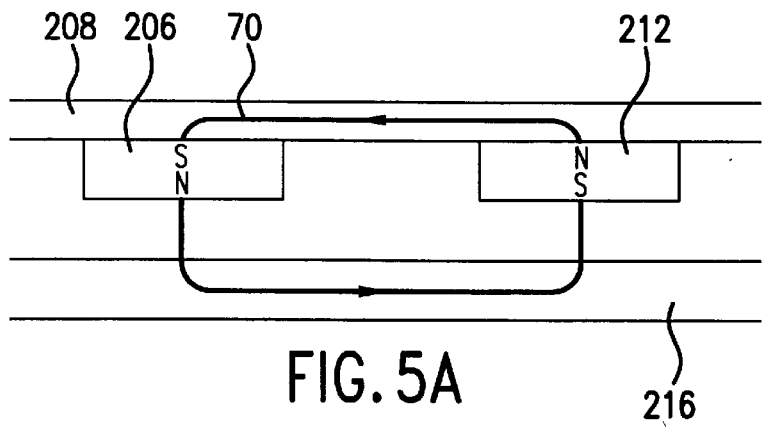
FIG.5A
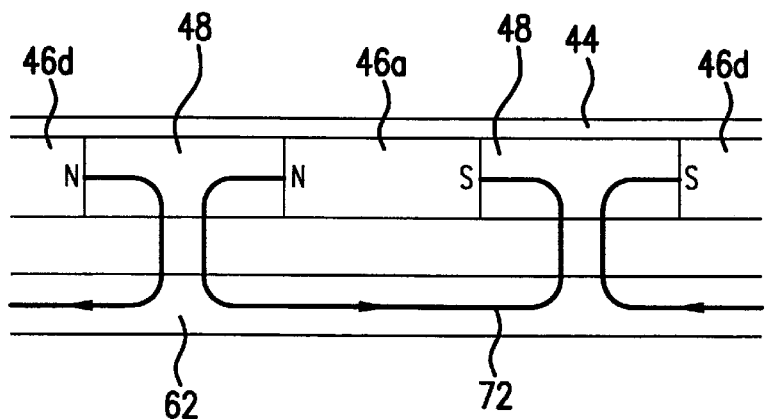
FIG.5B
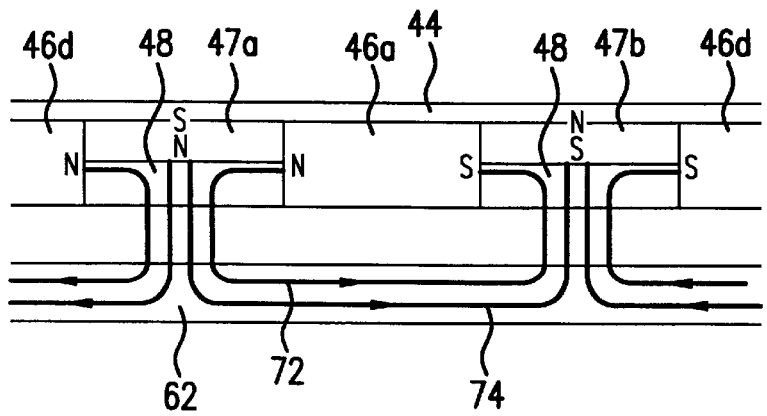
FIG.5C
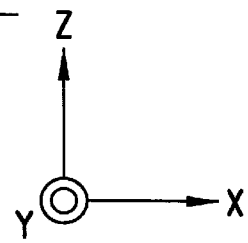

ELECTROMAGNETIC MOTOR

INCORPORATION BY REFERENCE

The disclosures of the following priority applications are herein incorporated by reference: Japanese Patent Application No. 9-278171, filed Sep. 25, 1997; and Japanese Patent Application No. 10-229739, filed Aug. 14, 1998.

BACKGROUND OF THE INVENTION

1. Field of Invention

The present invention relates to an electromagnetic motor that generates thrust from a magnetic flux using Lorenz's forces generated by flowing current in a coil. In particular, this electromagnetic motor is especially suitable for use with a stage used in an Electron Beam (EB) exposure device or in a projection exposure device used to manufacture, for example, integrated circuits (ICs), liquid crystal displays (LCDs) and other thin film devices.

2. Description of Related Art

A conventional linear type electromagnetic force motor is explained referring FIGS. 9A and 9B. FIG. 9A is a plan view of a linear type electromagnetic motor. FIG. 9B is a cross sectional view of FIG. 9A, which is cut along the line B—B. The electromagnetic motor is schematically composed of a pole unit 400 and a thrust generating unit 300. The pole unit 400 is composed of, for example, low carbon steel as a magnetic member and a rectangular parallelepiped shaped yoke 208 that extends in the X direction in the figure. A plurality of permanent magnets 204 and 210 that are alternately aligned (i.e., the N and S poles of adjacent magnets are alternately arranged) with a predetermined pitch P in the X direction are provided on the +Y direction side surface of the yoke 208. The permanent magnets 204 and 210 have magnetic axes that approximately match in the Y direction. The S poles of the permanent magnets 204 are polarized on the surface facing in the +Y direction, and the N poles are polarized on the surface facing in the −Y direction. On the other hand, the N poles of the permanent magnets 210 are polarized on the surface facing in the +Y direction, and the S poles are polarized on the surface facing in the −Y direction. Additionally, both magnetic pole ends of each of the permanent magnets 204 and 210 have a width of P/2 in the X direction.

The thrust generating unit 300 sandwiches the pole unit 400 from the +Y direction and the −Y direction, and has two cores 200 and 216 that are composed of, for example, low carbon steel as a magnetic member. An armature coil 202, which opposes the end surfaces of the plurality of permanent magnets 204 and 210 with a specified spacing, is provided on the +Y direction surface side of the yoke 208. The armature coil 202 has an opening in the X-Z surface (i.e, the surface contained in the XZ plane), and the coil is wound so that the aforementioned opening extends in the Y direction. The two surfaces of the armature coil 202 that are opposed to the permanent magnets 204 and 210 have a width of P/2 in the X direction, respectively, and have a longer width than the length of the permanent magnets 204 and 210 in the Z direction as shown in FIG. 9B. Additionally, the distance between centers of the two surfaces of the armature coil 202 equals the pitch P in the X direction.

Regarding the yoke 208 of the pole unit 400 and the core 216 that opposes it from the −Y direction, an armature coil 214 is provided on core 216 and is opposed to the end surfaces of a plurality of permanent magnets 206 and 212 that are provided on the −Y direction side surface of the yoke 208 with a predetermined spacing therebetween. The armature coil 214 has an opening in its X-Z surface, and the coil is wound so that the aforementioned opening extends in the Y direction. The two surfaces of the armature coil 214 that are opposed to the end surfaces of the permanent magnets 206 and 212 have a width of P/2 in the X direction, and have a longer width than the length of the permanent magnets 206 and 212 in the Z direction. Additionally, the distance between the centers of these two surfaces is equal to the length of the pitch P in the X direction.

A specified current is supplied from a power device, which is not shown in the figure, to the armature coils 202 and 214. Additionally, the pole unit 400 is supported so as to be movable in the X direction relative to the thrust generating unit 300 by a supporting mechanism, which is not shown in the figure.

In the electromagnetic motor having the above-mentioned structure, when the thrust generating unit 300 and the pole unit 400 are in the relative position shown in FIGS. 9A and 9B, a magnetic flux loop 218 of one cycle is formed as shown in the figure. The magnetic flux of this magnetic flux loop 218, for example, starting at the permanent magnet 204, comprises a closed magnetic path that goes through the yoke 208 of the magnetic body, the permanent magnet 206, passes through the surface of the armature coil 214 that extends in the Z direction, goes through the magnetic core 216 and passes through the other side surface of the armature coil 214 that extends in the Z direction, reaches the permanent magnet 212, passes through the yoke 208 and the permanent magnet 210, passes through a surface of the armature coil 202 that extends in the Z direction, passes through the magnetic core 200, and passes through the other side surface of the armature coil 202 that extends to the Z direction, and returns to the permanent magnet 204.

The current flows in the direction shown in FIG. 9A with respect to the armature coils 202 and 214 from a power device, not shown in the figure. In FIG. 9A, the "•" symbol indicates that the current flows outward from the paper surface, and the "x" symbol indicates that current flows into the paper surface. Hereafter, the "•" and "x" directions are called the axis directions of the coil.

As shown in the figure, by supplying current in the Z direction through the armature coils 202 and 214, a Lorentz's force is generated in the X direction in accordance with Fleming's left hand rule in the areas where magnetic flux passes out of the armature coils 202 and 214 and into the permanent magnets 204, 206, 210 and 212. When the thrust generating unit 300 is anchored at a specified position, the pole unit 400, which is movably held in the X direction by a supporting member (not shown in the figure) shifts in the +X direction by using the reaction of the Lorentz's force. By doing this, an electromagnetic motor can be structured with the thrust generating unit 300 as the stationary part and the pole unit 400 as the moving part. Further, a planar motor can be structured by developing this linear type electromagnetic motor in two-dimensions.

However, with the conventional electromagnetic motor explained above, the following problems occur.

(1) Problems with high thrust force and high efficiency

The permanent magnet surfaces of the magnets 204, 206, 210 and 212 that are used in the conventional electromagnetic motor are directly arranged so that magnetic flux passes parallel to the winding axes of the armature coils 202 and 214 of the thrust generating unit 300, as is clear from FIG. 9A. Accordingly, in order to improve the thrust, a permanent magnet having a high energy must be used, and accordingly the magnetic path cross-sectional area of the magnetic circuit has to be enlarged. However, with this method, there are problems in that the total cost of the permanent magnet is large and the efficiency becomes poor since the weight of the pole unit 400 when it is used as the moving part becomes large.

(2) Problems of preventing the failure of the magnets

In the conventional electromagnetic motor, there are problems in that the permanent magnets 204, 206, 210 and 212 are arranged in order to have a magnetic axis (magnetic direction) parallel to the winding axes of the armature coils 202 and 214. In this case, the magnetic field produced by excitation of the armature coils 202 and 214 (due to the corkscrew rule) also operates as a demagnetization field with respect to the permanent magnets 204, 206, 210 and 212. Therefore, the permanent magnets 204, 206, 210 and 212 become demagnetized or degaussed. Another problem is that the magnet surface burns due to the eddy currents generated in the permanent magnets 204, 206, 210 and 212.

(3) Problems of high thrust density

In a planar electromagnetic motor in which the conventional linear electromagnetic motor is two dimensionally developed, there are problems in that a large surface area is necessary since armature coils must be separately provided for the coil for X axis driving and the coil for Y axis driving. These drive coils for each axis are anchored and arranged on independent areas on the thrust generating unit, and the driving force per unit has to be small.

Another problem is that since the X axis driving force and the Y axis driving force operate in different positions, unnecessary rotation force is generated in the moving part, the control of which becomes difficult.

SUMMARY OF THE INVENTION

An object of the present invention is to solve the technical problems of the above-mentioned conventional electromagnetic motor. Thus, it is an object of the present invention to provide an electromagnetic motor that can achieve high thrust and high efficiency by generating high magnetic flux density without making the permanent magnets large.

Another object of the present invention is to avoid causing a demagnetization field to the permanent magnets by the armature coil, and to provide an electromagnetic motor that prevents the burning of the permanent magnets.

Another object of the present invention is to make the driving force per area unit large, and to provide a planar electromagnetic motor that does not cause unnecessary rotating force to be applied to the moving part.

According to one embodiment of the present invention, the above-mentioned objects are achieved by providing an electromagnetic motor having a pole unit that has a plurality of magnets (e.g., permanent magnets) in which same poles of adjacent magnets oppose each other and are aligned in one direction with a specified pitch P, and a plurality of yokes that are interposed between the plurality of magnets and aligned in one direction having the pitch P. A thrust generating unit has a plurality of armature coils opposed to the pole unit via a predetermined space, and surrounded by a space equal to the pitch P, and a magnetic core that anchors the plurality of armature coils so as to align the plurality of armature coils in one direction.

Preferably, the plurality of armature coils are relatively shifted by 1/n (n is an integer of 2 or more) of the pitch P, and are arranged on the cores. Additionally, the armature coils can have hollow centers.

According to another embodiment, an electromagnetic motor has a pole unit having a plurality of magnets (e.g., permanent magnets) in which same poles of adjacent magnets oppose each other and are aligned in X and Y directions with a specified pitch P, and a plurality of yokes interposed between the plurality of magnets in the X and Y directions. A thrust generating unit has a plurality of armature coils are that opposed to the pole unit in parallel via a specified space, and are surrounded by a space equal to the pitch P, and a magnetic core that anchors the plurality of armature coils in the X and Y directions.

In this electromagnetic motor, the plurality of magnets are arranged such that a direction of each magnetic axis is inclined by approximately 45° with respect to the X and Y directions. Additionally, a non-magnetic, non-conductive member preferably is interposed in an area that is surrounded by the plurality of yokes. Additionally, on a back surface of the plurality of yokes, opposite the surface that opposes the armature coils, magnets are provided with their magnetic axis in the Z direction, with same poles facing the poles of the yokes that are magnetized by the magnets. Additionally, the thrust generating unit can have a plurality of the armature coils for X driving that are arranged relatively shifted by 1/n (n is an integer of 2 and more) of the pitch P in the X direction and, a plurality of the armature coils for Y driving that are arranged relatively shifted by 1/n (n is an integer of 2 and more) of the pitch P in the Y direction. Additionally, the armature coils can have hollow centers.

According to another embodiment, an electromagnetic motor has a pole unit having a plurality of pairs of magnets, each pair of magnets having a first magnet and a second magnet, the first magnet having poles that are opposed to same poles of the second magnets, the poles of each pair of magnets being opposed to same poles of an adjacent pair, the pairs of magnets being aligned in X and Y orthogonal directions with a pitch P. The pole unit also has a plurality of yokes interposed between the plurality of pairs of magnets in the X and Y directions. A thrust generating unit has a plurality of armature coils opposed in parallel with the pole unit via a specified space, and surrounded by a space equal to the pitch P, and a magnetic core that anchors the plurality of armature coils in the X and Y directions.

According to the present invention, the conventional technical problems can be solved by the following effects.

(1) Problems of high thrust and high efficiency

Since the permanent magnets are arranged so that the magnetic polarization directions are opposed, front and rear and left and right on the X-Y plane, and the magnetic yoke that comprises the magnetic circuit is arranged therebetween, a high magnetic flux can be generated in the magnetic circuit structured between the pole unit and the thrust generating unit.

At this time, the magnetizing direction of the permanent magnet of a planar motor is inclined with respect to each of the X-axis and the Y-axis of the X-Y plane. For example, they are polarized in a direction of 45°. By doing this, since the yokes adjacent at the front, rear, left and right of the permanent magnets are each magnetized so as to have poles, the magnetic flux of the magnets can be effectively used for generating electromagnetic force.

(2) Problems of preventing magnet failure

Since permanent magnets that have a magnetic direction are arranged at a right angle with respect to the axis of the armature coil, and since magnetic yokes are arranged between the permanent magnets and the magnetic circuit that supply the magnetic flux from the yokes to the armature coil, the demagnetizing field from the armature coil does not directly affect the permanent magnets. Additionally, burning of the permanent magnets can be prevented.

(3) Problems of high thrust density

Since each X driving coil and each Y driving coil are alternately arranged, the driving force per unit surface area can be improved. Additionally, since the X driving force and the Y driving force function at the same point, rotating force does not occur, and it is easy to control.

BRIEF DESCRIPTION OF THE DRAWINGS

The invention will be described in conjunction with the following drawings in which like reference numerals designate like elements and wherein:

FIGS. 2A–2D show the operation of a planar motor that is the basic form of electromagnetic motor of a second embodiment of the present invention;

FIGS. 5A–5C show the generation of a magnetic flux loop in the planar electromagnetic motor of the second embodiment of the present invention;

DETAILED DESCRIPTION OF PREFERRED EMBODIMENTS

Figure 1A:
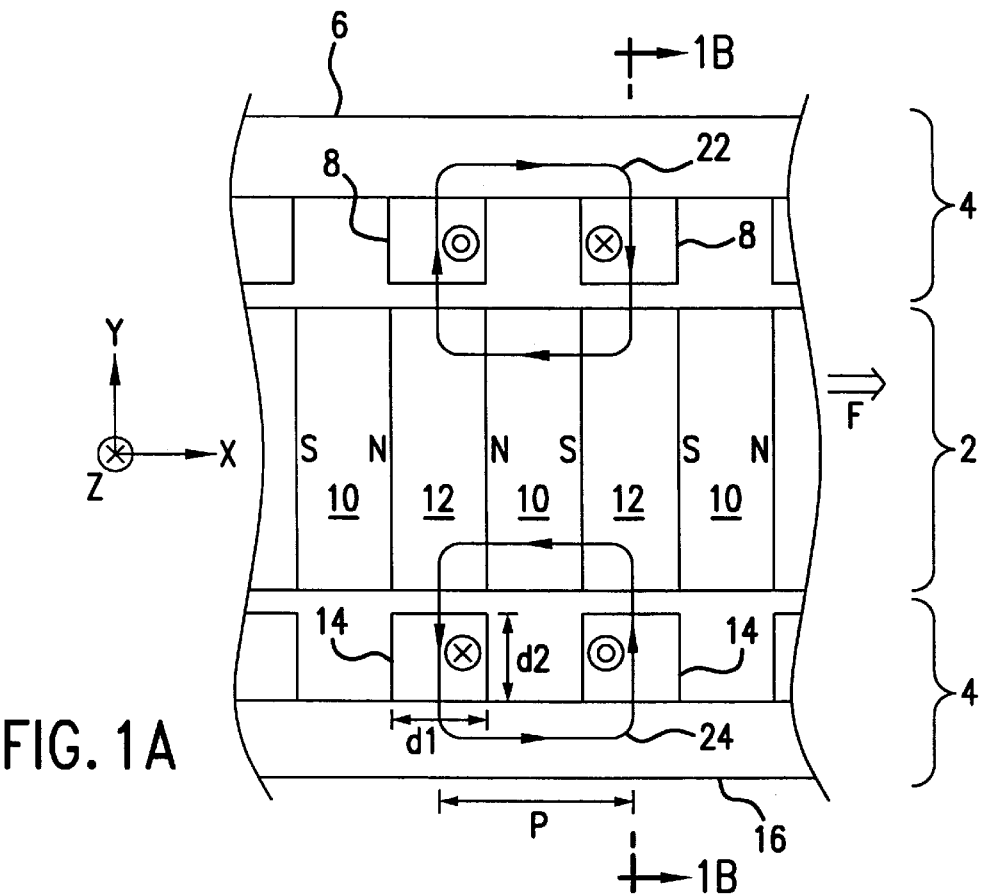
FIGS. 1A and 1B show the schematic structure of a linear type electromagnetic motor of a first embodiment of the present invention.
Figure 1B:
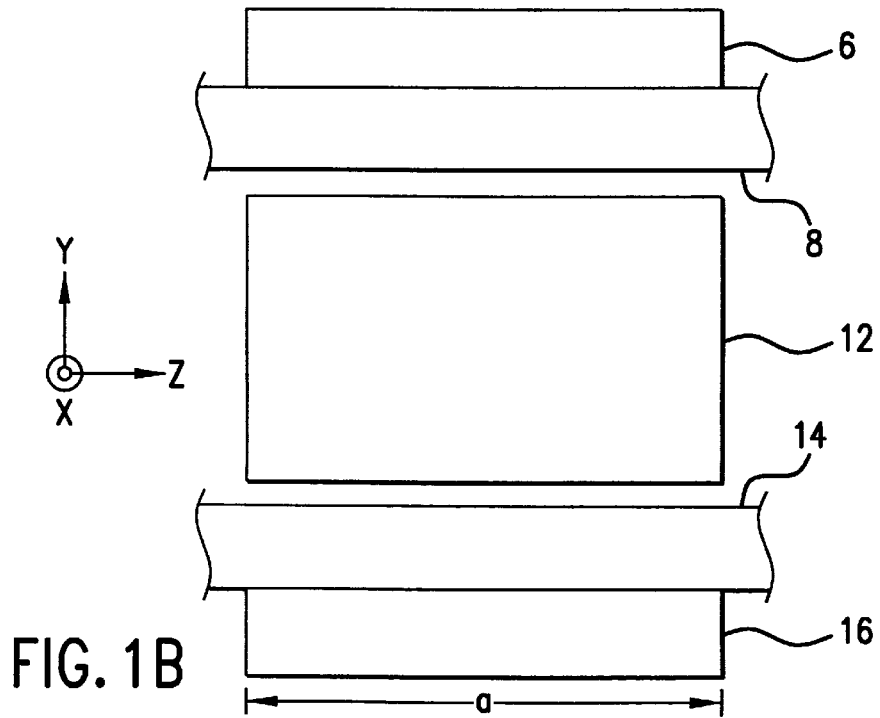

An electromagnetic motor according to a first embodiment of the present invention is explained referring to FIGS. 1A and 1B. FIG. 1A shows the schematic structure of the electromagnetic motor of the first embodiment. The electromagnetic motor of the first embodiment is a linear motor in which a movable body shifts in one axial direction.

FIG. 1A is a plan view of the linear type electromagnetic motor of the present embodiment. FIG. 1B is a cross section cut along line B—B. The electromagnetic motor is schematically composed of the pole unit 2 and the thrust generating unit (thrust generator) 4. The pole unit 2 has a plurality of permanent magnets 10 that are aligned at a specified pitch P in the X direction, and with the poles aligned in the X direction so that same poles of adjacent magnets oppose each other. A plurality of yokes 12 made of magnetic bodies of, for example, low carbon steel are interposed between the plurality of permanent magnets 10, and aligned at the pitch P in the X direction. The width in the X direction of the permanent magnets 10 and yokes 12 is P/2. The entire pole unit 2 has a rectangular shape, which is elongated in the X direction. Additionally, for the permanent magnets 10 of the first embodiment, material such as, for example, Neomax42 (made by Sumitomo Special Metal Industries), which has a residual magnetic flux density Br=1.33 [T], and relative permeability $\mu$=1.0667, Hc=947000 [A/m] can be used.

The thrust generating unit 4 has two cores 6 and 16 that sandwich the pole unit 2 from the +Y direction and the −Y direction and are made of a magnetic body, for example, a low carbon steel magnet. An armature coil 8, which is opposed to the pole unit 2 via a specified space in the +Y direction, is provided on the core 6, which is opposed to the pole unit 2 from the +Y direction. The armature coil 8 is hollow and has an opening in its X-Z surface, and the coil is wound so that the aforementioned opening extends in the Y direction. The two surfaces of the armature coil 8 that oppose the side surface of the pole unit 2 have widths of P/2 in the X direction, and have a longer width in the Z direction than the length of the pole unit 2 as shown in FIG. 1B. Additionally, the distance between the centers of these two surfaces is equal to the pitch P in the X direction.

The armature coil 14 that opposes from the −Y direction of the pole unit 2 via a specified space is provided on the core 16 that opposes pole unit 2 from the −Y direction. The armature coil 14 is hollow and has an opening in its X-Z surface, and the coil is wound so that the aforementioned opening extends in the −Y direction. The two surfaces of the armature coil 14 that oppose the side surface of the pole unit 2 have a width of P/2 in the X direction, and have a longer width in the Z direction than the length of the pole unit 2 as shown in FIG. 1B.

These armature coils 8 and 14 have a winding wire diameter d of the coil=0.5 [mm]. The current value I supplied to the coil=1.0 [A], and for the current density, with 49 as the number of coils in the cross section d1×d2, shown in FIG. 1A, =4×4 (mm$^2$) of the coil in the X-Y plane, the current density $\alpha$=(49×1.0)/(4×4)=3.06 [A/mm$^2$]=3.06×10$^6$ [A/m$^2$].

A specified current from a power device (not shown) is supplied to the armature coils 8 and 14. Additionally, the pole unit 2 is supported by a support mechanism, which is not shown in the figure, so as to be movable in the X direction relative to the thrust generating unit 4.

In the linear type electromagnetic motor of the first embodiment, when the thrust generating unit 4 and the pole unit 2 are in the relative position shown in FIG. 1A, two magnetic flux loops 22 and 24 (shown in the figure) are formed. The magnetic flux of the magnetic flux loop 22 forms a closed magnetic circuit that passes from the pole of the permanent magnet 10 positioned at the center of FIG. 1A, and of which the N pole faces the −X direction and the S pole faces the +X direction, goes through the yoke 12 which contacts the aforementioned N pole (the left side of the aforementioned permanent magnet 10 in FIG. 1A), passes from the +Y direction side surface of the yoke 12 through one coil, among the coils of the armature coil 8, that extends in the Z direction, goes through the magnetic core 6 and through another coil, among the coils of the armature coil 8, that extends in the Z direction, and reaches the S pole of the aforementioned permanent magnet 10 via the yoke 12 at the right of the aforementioned permanent magnet 10.

Additionally, the magnetic flux of the other magnetic flux loop 24 forms a closed magnetic circuit that passes from the N pole of the permanent magnet 10 that is positioned in the center of FIG. 1A, and of which the N pole faces the −X direction and the S pole faces the +X direction, goes through the yoke 12 that contacts the aforementioned N pole (the left side of the aforementioned permanent magnet 10 in FIG. 1A), passes from the −Y direction side surface of the yoke 12 through one coil among the coils of the coil 14, that extends in the Z direction, goes through the magnetic core 16 and through another coil among the coils of armature coil 14 that extends in the Z direction, and reaches the S pole of the aforementioned permanent magnet 10 via the yoke 12 at the right of the aforementioned permanent magnet 10.

At this time, the current flows in the direction shown in FIG. 1A to the armature coils 8 and 14 from the power device, which is not shown in the figure. In FIG. 1A, a "•" symbol indicates that the current flows in a direction out of the paper surface, and an "x" symbol indicates that current flows in a direction into the paper surface.

By supplying current to the armature coils 8 and 14, a Lorentz's force is generated in the +X direction in accordance with Fleming's left hand rule due to the magnetic flux that passes out of the surfaces of the armature coils 8 and 14 and the magnetic flux of the permanent magnets 10. When the thrust generating unit 4 is anchored at a specified position, the pole unit 2 which is mounted to move in the X direction by a supporting member (not shown) shifts in the +X direction as a reaction to the Lorentz's force. When the direction of the current that flows to the armature coils 8 and 14 is reversed, it is possible to reverse the direction of movement of the pole unit 2. Thus, the electromagnetic motor is structured with the thrust generating unit 4 as the stationary part and the pole unit 2 as the moving part. Further, the thrust generating unit 4 can function as the moving part, and the pole unit 2 can function as the stationary part by fixedly mounting the pole unit 2 and movably mounting the generating unit 4.

Additionally, in the electromagnetic motor of the first embodiment, if a plurality of the armature coils 8 and 14 are arranged relatively shifted by 1/n (n is an integer of 2 or above) of the pitch P, the electromagnetic motor can be realized in which irregularities in the thrust are decreased. In other words, smooth movement is possible.

Here, if the magnetic flux density Bg of the magnetic flux that passes through the areas of the armature coils 8 and 14 in which the current flows in the Z direction in the condition of FIG. 1A is obtained by simulation, Bg=0.223–0.591 [T], and the average magnetic flux density Bga=0.407 [T]. Additionally, when the current value I that flows in the armature coils 8 and 14 is I=1.0 [A], and when the length of the armature coil in the magnetic flux is the length a=0.03 [m] of the coil of the Z direction shown in FIG. 1B, 1=49 [coils]×0.03 [m]×4 [places]. Accordingly, the thrust (Lorentz's force) F generated by the electromagnetic motor of the present embodiment becomes F=Bga×I×1=0.407 [T]× 1.0 [A]×49 [coils]×0.03 [m]×4 [places]=2.39 [N].

Figure 9A:
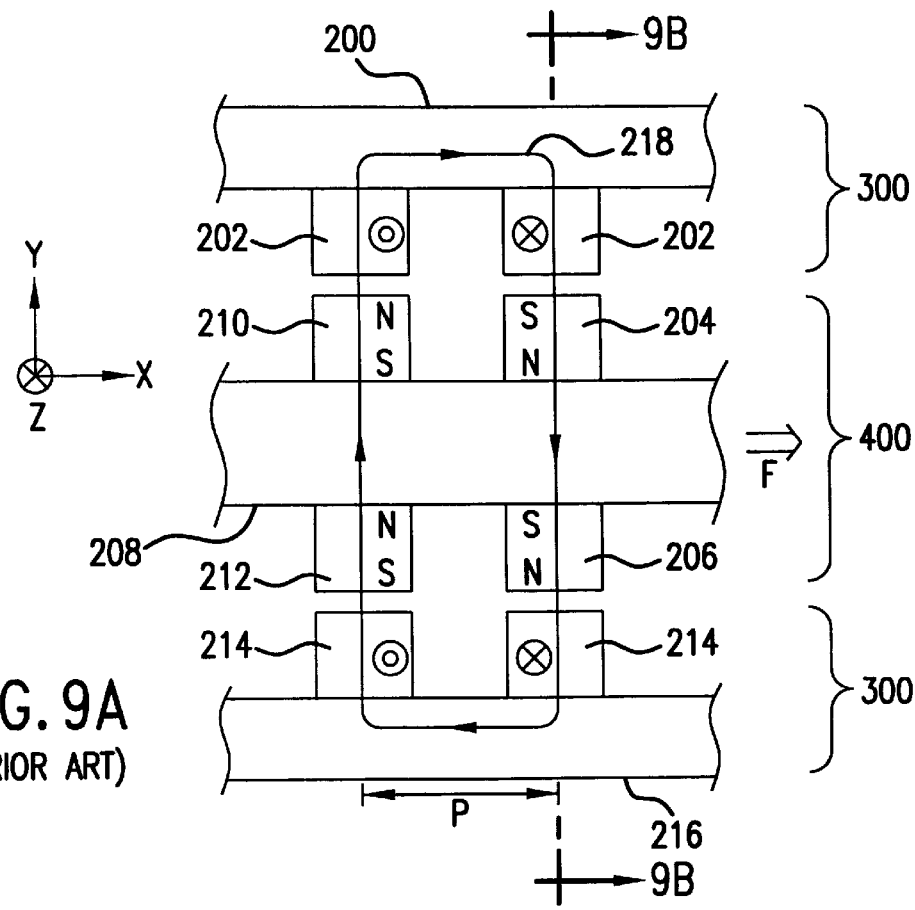
FIGS. 9A–9B show a conventional linear type electromagnetic motor.
Figure 9B:
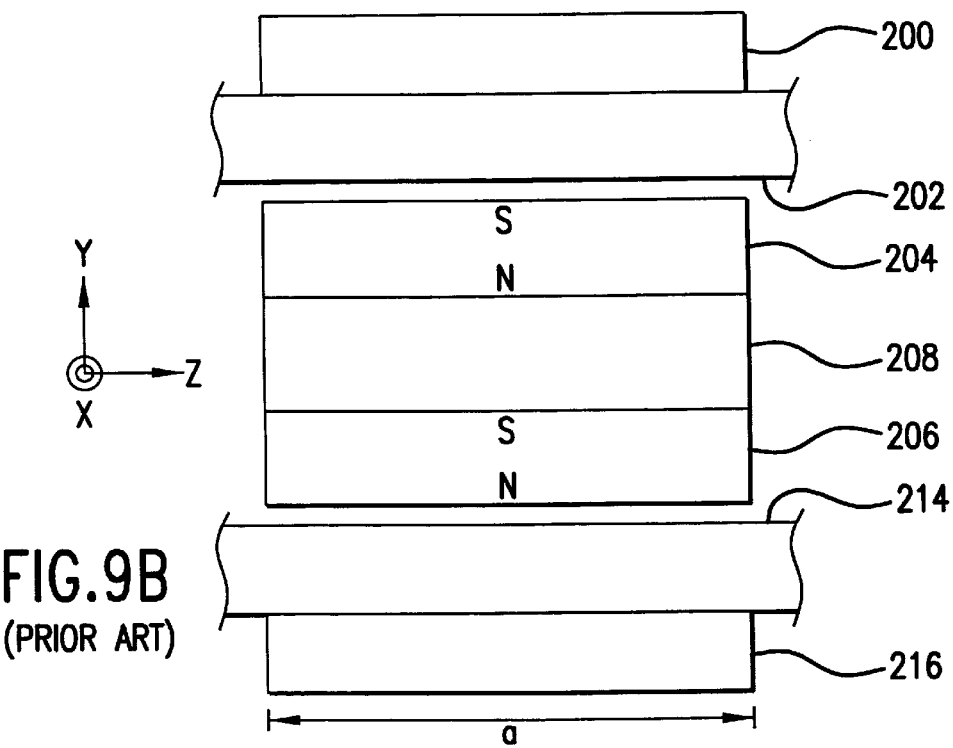

The generated thrust obtained for a conventional electromagnetic motor explained using FIGS. 9A–B is now used as a comparative example. First of all, the magnetic flux density Bg of the magnetic flux that passes through the areas among the armature coils 202 and 214 in the condition of FIG. 9A, in which the current flows in the Z direction is obtained by simulation, Bg=0.03297–0.32417 [T], and the average magnetic flux density Bga=0.1786 [T]. When other conditions are the same as used above for the electromagnetic motor of the first embodiment, the thrust (Lorentz's force) F which is generated becomes F=Bga×I×1=0.1786 [T]×1.0 [A]×49 [coils]×0.03 [m]×4 [places]=1.05 [N].

As stated above, with the electromagnetic motor of the first embodiment, an improved thrust of 2.3 times better than a conventional electromagnetic motor can be obtained.

According to the first embodiment, since the pole unit 2 is composed of a plurality of permanent magnets 10 with same poles of adjacent magnets opposed to each other and aligned at a specified pitch P in the X direction with their poles aligned in the X direction, and a plurality of yokes 12 that are composed of a magnetic body that are interposed between the plurality of permanent magnets 10 and are aligned at the pitch P in the X direction, a high magnetic flux density can be generated in a magnetic circuit composed by the pole unit 2 and the magnetic body of the thrust generating unit 4, and a high thrust and the high efficiency are achieved.

Additionally, according to the electromagnetic motor of the first embodiment, since there are no poles of the permanent magnets 10 that are close to the armature coils 8 and 14, the electromagnetic motor does not receive the influence of the magnetic field generated in the armature coils 8 and 14. In other words, the magnetic fields generated in the armature coils 8 and 14 only pass therethrough, and burning of the permanent magnets 10 can be prevented.

Next, an electromagnetic motor of a second embodiment of the present invention is explained by using FIGS. 2A–D and 6A–B. The electromagnetic motor of the second embodiment is a planar type motor that is movable in two axial (perpendicular) directions. The planar motor that is the basic form of the electromagnetic motor of the second embodiment is explained. FIG. 2A is a perspective plan diagram in which a part of the planar motor is viewed through the back side. FIG. 2B is a cross section diagram cut along the line B—B of FIG. 2A. As shown, the main structural elements of this planar motor are the thrust generating unit 28, which is as the fixed element, and the pole unit 40, which is the movable element.

The pole unit 40 has magnetic yokes 48, a plurality of permanent magnets 46 interposed between a plurality of the magnetic yokes 48 and having same poles of adjacent magnets opposed to each other, and a flat magnetic yoke 44 that anchors the magnetic yokes 48 and the permanent magnets 46 to each other. The permanent magnets 46 are alternately arranged being shifted by the pitch P in a plane, and the width of each is P/2. Additionally, the magnetic axes of the magnets 46 are facing in the X direction, and are arranged so that the poles of the magnetic yokes 48 become N poles and S poles.

The main structural elements of the thrust generating unit 28 are a plurality of armature coil 36a, 36b, . . . , and the like, and a flat magnetic core 38 that anchors a plurality of the armature coils 36a, 36b . . . to each other. On one surface of the core 38, the armature coils 36a, 36b . . . that oppose the end surfaces of the permanent magnets 46 of the pole unit 40 are anchored. Each armature coil 36a, 36b . . . is hollow and has an opening in its X-Y surface. The coils are wound so that the aforementioned opening extends in the Z direction. The openings of the armature coils 36a, 36b . . . have a rectangular (in this case square) shape that has a width of P/2 in both the X and Y directions. The coil which is wound around the opening has a width of P/2 in the X-Y plane. Accordingly, the distance between the centers of adjacent coils is 3P/2, and they are arranged to be relatively shifted by P/2 in the X and Y directions.

The pole unit 40 is supported so as to be two dimensionally movable in the X-Y plane with respect to the thrust generating unit 28 by a support mechanism (for example, an air bearing or the like), which is not shown in the figure, via a specified space.

The operation of the planar motor having the above structure is now explained. FIG. 2A shows the direction of the current that flows in the armature coil of the thrust generating unit 28 and the direction in which the magnetic flux operates. Additionally, FIGS. 2A and 2B show the generation of a thrust by a Lorentz's force based on Fleming's left hand rule. As shown in FIGS. 2A and 2B, magnetic yokes 48 are positioned on the area of coils that faces the Y direction of the armature coil 36a, 36b . . . , and magnetic flux from the magnetic yokes 48 has the magnetic flux density B, and passes through the coils that face the Y direction of the armature coil 36a. When a specified current I flows clockwise in the figure from the power device, which is not shown in the figure, and to the armature coil 36a, a Lorentz's force is generated which tries to shift the coils that are aligned in the Y direction of the armature coil 36a to the left direction (−X direction) in the figure.

The thrust generating unit 28 is anchored in a specified position, and the pole unit 40, which is movably supported by the support mechanism (by an air bearing or the like), shifts in the +X direction by reacting to the Lorentz's force. When the direction of the current that flows in the armature coil 36a is reversed, it is possible to reverse the direction of movement of the pole unit 40. Thus, an electromagnetic motor is structured with the thrust generating unit 28 as the stationary part, and the pole unit 40 as the moving part. Further, the pole unit 40 can function as the stationary part and the thrust generating unit 28 can function as the movable part by fixedly mounting the pole unit 40 and movably mounting the thrust generating unit 28.

Next, the fact that the thrust is smoothed by using the armature coil 36b in addition to the armature coil 36a is explained referring to FIGS. 2C and 2D. FIG. 2C shows the characteristics of the current that flows in the armature coil 36a and the thrust that is generated. Additionally, FIG. 2D shows the characteristics of the current that flows in the armature coil 36b and the thrust that is generated. As explained by using FIGS. 2A and 2B, since the armature coil 36a and the armature coil 36b are arranged so as to be relatively shifted by P/2, in the condition in which the permanent magnets 46 of the pole unit 40 are opposed on (or over) the armature coil 36b, the magnetic flux that passes through the coils of the armature coil 36b is virtually non-existent, and the armature coil 36b does not contribute to the thrust generation. However, when the pole unit 40 starts shifting with the thrust generated by the armature coil 36a, and the magnetic yoke 48 is shifted, the magnetic flux that passes through the coil in the Y direction of the armature coil 36a is gradually decreased, and the thrust obtained from the armature coil 36a is gradually decreased. Meanwhile, the magnetic yoke 48 becomes closer to the position opposed to the armature coil 36b along with the shifting of the pole unit 40, and the magnetic flux that passes through the coil in the Y direction of the armature coil 36b increases. Therefore, when a specified current is supplied to the armature coil 36b at a specified energizing schedule, a thrust can be generated by the armature coil 36b. The armature coil 36b is in the position shifted by P/2 with respect to the armature coil 36a, and the thrust characteristic becomes as shown in FIGS. 2C and 2D. An overall smooth thrust characteristic can be obtained by driving to compose the waveforms of FIGS. 2C and 2D.

Figure 3A:
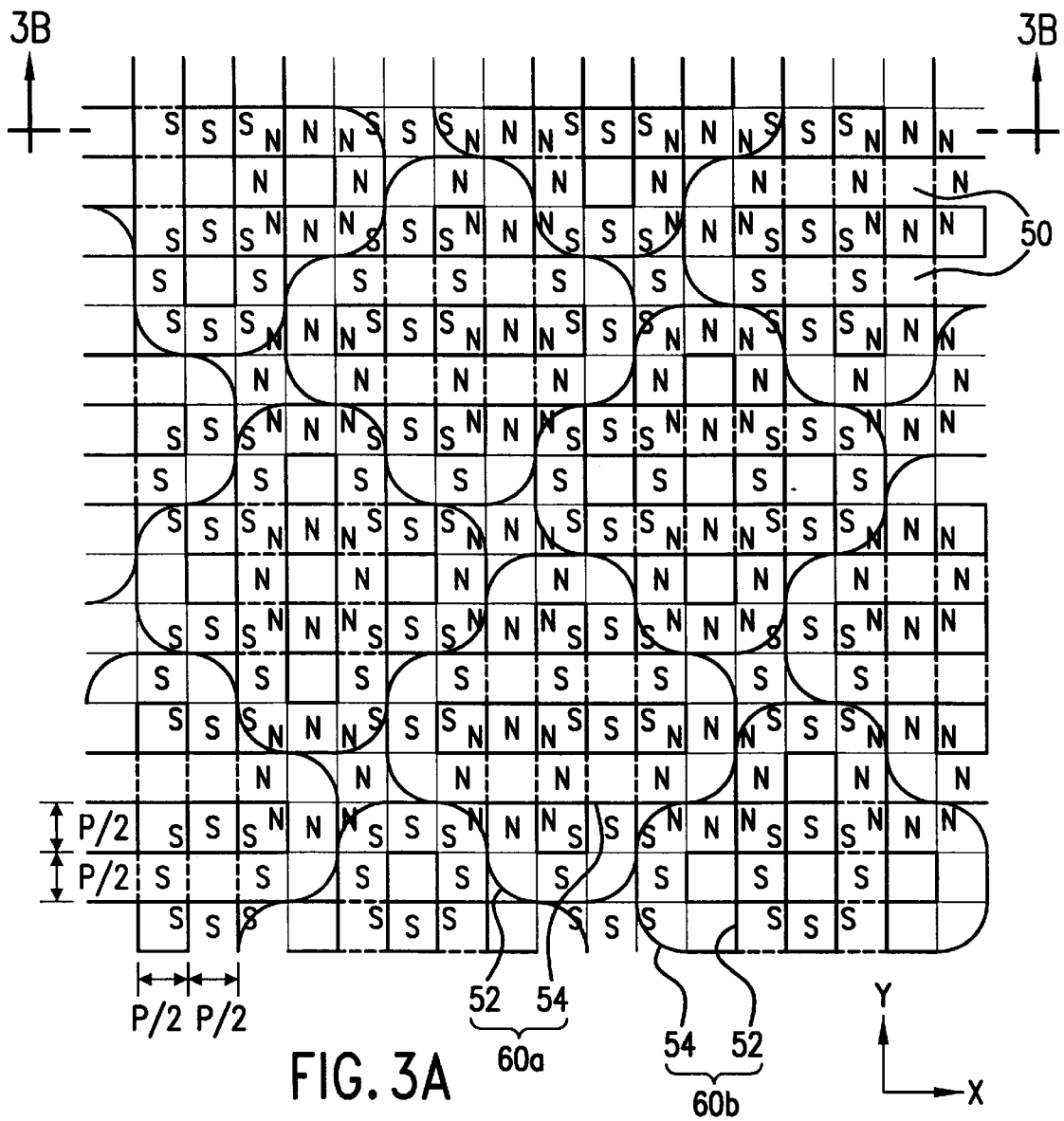
FIGS. 3A and 3B show a schematic structure of the planar electromagnetic motor of the second embodiment of the present invention.
Figure 3B:
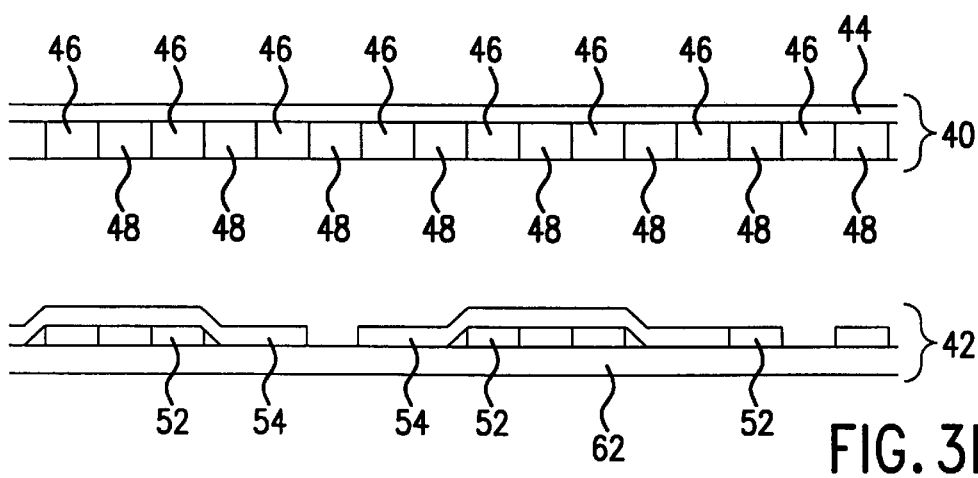

FIG. 3A is a perspective plan view in which the entire electromagnetic motor is viewed through the back surface. FIG. 3B is a cross sectional view along line B—B of FIG. 3A. As shown, the main structural elements of the planar electromagnetic motor of the present embodiment are the thrust generating unit 42, which is the stationary part, and the pole unit 40, which is the movable body. The pole unit 40 is composed of a plurality of the permanent magnets 46 that have cubical shapes, yokes 48 made of a plurality of magnetic bodies and a flat non-magnetic, non-conductive member 44 that aligns and fixes a plurality of non-magnetic, non-conductive members 50 in a matrix shape in the X-Y plane. The detailed structure of the pole unit 40 is later explained referring to FIGS. 4A and 4B.

The main structural elements of the thrust generating unit 42 are a plurality of armature coils 52 and 54 and a flat core 62 which is made of a magnetic body that anchors the plurality of the armature coils 52 and 54. On one surface of the core 62, a plurality of the armature coils 52 and 54 are affixed opposing the flat end surface formed by the permanent magnets 46 the yoke 48 and the non-magnetic, non-conductive members 50. The armature coils 52 and 54 are hollow and have openings in the X-Y plane, and the coils are wound so that the aforementioned openings extend in the Z direction.

The openings of the armature coils 52 have a rectangular shape having a width of P/2 in the X direction, and 5P/2 in the Y direction. The coils that are wound around the opening have a width of P/2 in the X-Y direction. Additionally, on the core 62, the armature coils 52 and 54 are crossed in the X-Y plane and arranged forming the units 60a and 60b as best seen in FIG. 3A. The armature coils 52 are used as the armature coils for X direction driving, and the armature coils 54 are used as the armature coils for the Y direction driving. Additionally, the units 60a and the units 60b of the adjacent armature coils 52 and 54 are arranged so as to be relatively shifted by P/2 in each of the X and Y directions.

The pole unit 40 is supported by a supporting mechanism, which is not shown in the figure, so as to be two dimensionally movable in the X-Y plane relative to the thrust generating unit 42, via a specified space.

Figure 4A:
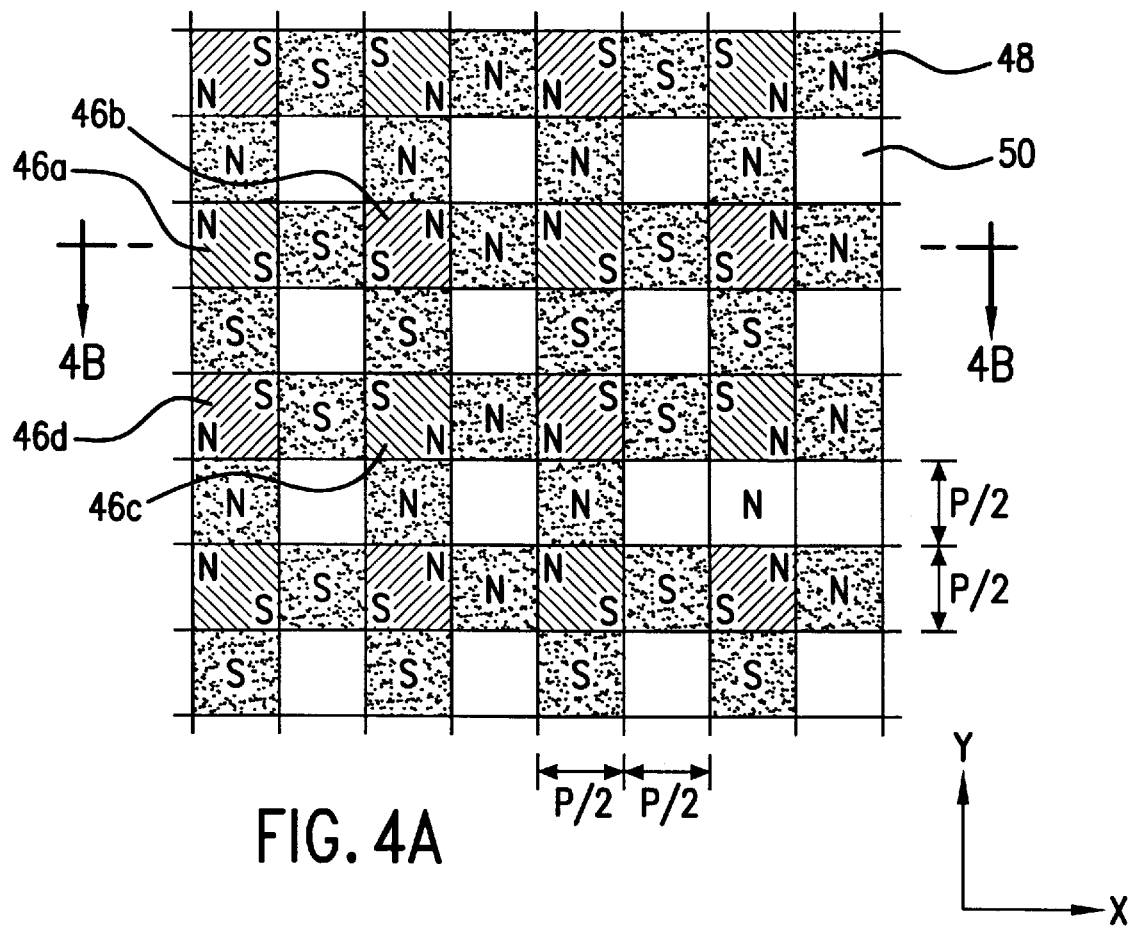
FIGS. 4A and 4B show a structure of the moving part of the planar electromagnetic motor of the second embodiment of the present invention.
Figure 4B:
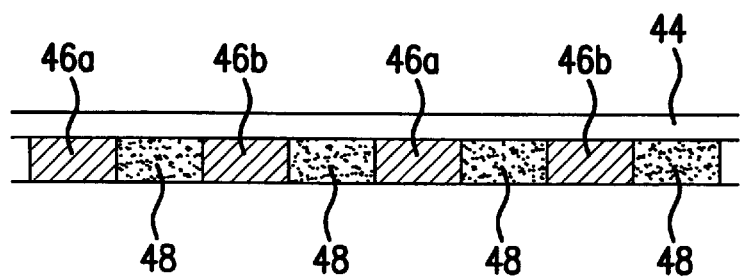

Next, the structure of the pole unit 40 is explained in detail referring to FIGS. 4A and 4B. FIG. 4A is a plan view of the pole unit 40, and FIG. 4B is a cross-sectional view along line B—B of FIG. 4A. The pole unit 40 has pluralities of four differently oriented cube-shaped permanent magnets 46a, 46b, 46c and 46d, same poles of adjacent magnets being opposed to each other. The permanent magnets are provided at a specified pitch P in the X-Y direction, the poles being parallel to the aforementioned X-Y plane. A plurality of the permanent magnets 46a, 46b, 46c and 46d are arranged so that the directions of the magnetic axes are inclined with respect to the X and Y directions. The inclination amount in the present embodiment is 45° with respect to each of the X and Y axes. A plurality of the permanent magnets 46a, 46b, 46c and 46d have square shapes that have ends (sides) parallel to the X axis and the Y axis in the X-Y plane. The permanent magnets 46a are polarized to have the N pole at the top left corner of the square shape and the S pole at the bottom right corner of the square shape. The permanent magnets 46b are polarized to have the N pole at the top right corner of the square shape and the S pole at the bottom left corner of the square shape. The permanent magnets 46c are polarized to have the S pole at the top left corner of the square shape and the N pole at the bottom right corner of the square shape. The permanent magnets 46d are polarized to have the S pole at the top right corner of the square shape and the N pole at the bottom left corner of the square shape. These pluralities of permanent magnets 46a, 46b, 46c and 46d are arranged by distributing in the X-Y plane shape so that the adjacent poles of adjacent magnets are same poles.

Additionally, between the spaces that are adjacent in the X and Y directions to the pluralities of permanent magnets 46a, 46b, 46c and 46d, cube shaped yokes 48 which are made of a magnetic body are respectively inserted at the pitch P. Accordingly, as shown in FIGS. 4A and 4B, each yoke 48 that is interposed between a plurality of permanent magnets 46a, 46b, 46c and 46d is polarized with the same poles as the poles of the permanent magnets that are adjacent to each other. For example, a yoke 48 which is interposed between the adjacent permanent magnets 46a and 46d is polarized to be an S pole.

Additionally, non-magnetic, non-conductive members 50 are inserted in the cubic areas that are surrounded by edges of four adjacent yokes 48. Ceramic or the like can be used for these members 50, or it is also appropriate to use air.

Next, the characteristic structure of the planar electromagnetic motor of the present embodiment is explained referring to FIGS. 5A–5C, along with comparative examples and developmental examples. FIG. 5A shows the conventional type of structure of the electromagnetic motor which was explained by referring to FIGS. 9A and 9B, as a comparison example. FIG. 5B shows the structure of the electromagnetic motor of the present embodiment. FIG. 5C shows the structure of a developmental type of electromagnetic motor according to the present embodiment in which the magnetic flux is further improved. Additionally, in FIGS. 5A–5C, the side cross sectional face of each electromagnetic motor is shown, and the identification of the armature coils is omitted.

The magnetic flux of the magnetic flux loop 70 generated by the planar electromagnetic motor shown in FIG. 5A, for example, using the permanent magnet 206 of the pole unit as the starting point, forms a path that goes through the magnetic core 216 of the thrust generating unit from the permanent magnet 206, then goes through the permanent magnet 212 of the pole unit, goes through the magnetic yoke 208 and returns to the permanent magnet 206.

In other words, as is clear from the figure, the permanent magnet surface of the permanent magnets 206 and 212 of the planar electromagnetic motor are directly arranged so that the magnetic flux goes through parallel to the axis of the armature coil (not shown in figure) of the thrust generating unit side. Accordingly, for the conventional electromagnetic motor shown in FIGS. 9A and 9B, there are problems in that permanent magnets which have a high energy product have to be adopted, and accordingly, the magnetic circuit cross sectional area of the magnetic circuit has to be enlarged in order to achieve a high thrust and high efficiency. Furthermore, there is a problem in that the permanent magnets 206 and 212 are demagnetized because of the influence of the magnetic field generated by the excitation of the armature coil. Additionally, there is a problem that the magnet surface is burned by the eddy current generated in the permanent magnets 206 and 212.

On the other hand, the magnetic flux of the magnetic flux loop 72 generated by the electromagnetic motor according the present embodiment, which is shown in FIG. 5B, for example, using the permanent magnet 46a of the pole unit as the starting point, forms a path that goes through the magnetic yoke 48 that is adjacent to the N magnetized surface of the permanent magnet 46a, then goes through the core 62 of the magnetic body of the thrust generating unit side, passes through a yoke 48 of the pole unit adjacent to the S magnetized surface of permanent magnet 46a, and returns to the permanent magnet 46a.

In other words, since the magnetizing directions of the permanent magnets 46a–46d are arranged to oppose each other at the front, rear, left and right in the X-Y plane, and since the yokes 48, which are made of magnetic bodies and form magnetic circuits are arranged between these permanent magnets 46a–46d, the magnetic flux can be concentrated in the yokes 48, and a high magnetic flux density can be generated in the magnetic circuits formed by the magnetic cores 62 of the thrust generating unit.

Additionally, since the yokes 48 that are adjacent at the top, rear, left and right of the permanent magnets 46a–46d, which are polarized in a direction of 45° with respect to the coordinate axes of the X-Y plane, have independent poles, the magnetic flux of the permanent magnets 46a–46d can be effectively used, and the magnetic flux density supplied to the armature coil of the thrust generating unit from the yoke 48 of the pole unit can be improved.

Additionally, by arranging the permanent magnets 46a–46d that are magnetized in the direction parallel to the X-Y plane and by arranging magnetic yokes 48 between the permanent magnets 46a–46d, it is possible to have a structure such that magnetic circuits are formed that supply the flux to the armature coils from the yokes 48, and in which a demagnetizing field from the armature coil does not directly operate. Additionally, it is possible to prevent burning of the permanent magnets 46a–46d.

The structure shown in FIG. 5C is a developmental type of planar electromagnetic motor of the present embodiment. This motor includes permanent magnets 47a and 47b, of which the direction of the magnet axis is the Z direction. The poles of permanent magnets 47a and 47b face same poles of the yokes 48, which are magnetized by the permanent magnets 46a–46d, and are arranged on the back surfaces of the yokes 48, which are opposite the surfaces that face the armature coil (not shown in the figure). By providing this structure, a magnetic flux loop 74, which reaches the permanent magnet 47b via the core 62 from the permanent magnet 47a, can be generated in addition to the magnetic flux loop 72. Therefore, the magnetic flux density of the magnetic flux supplied to the armature coil can be further improved.

Figure 6A:
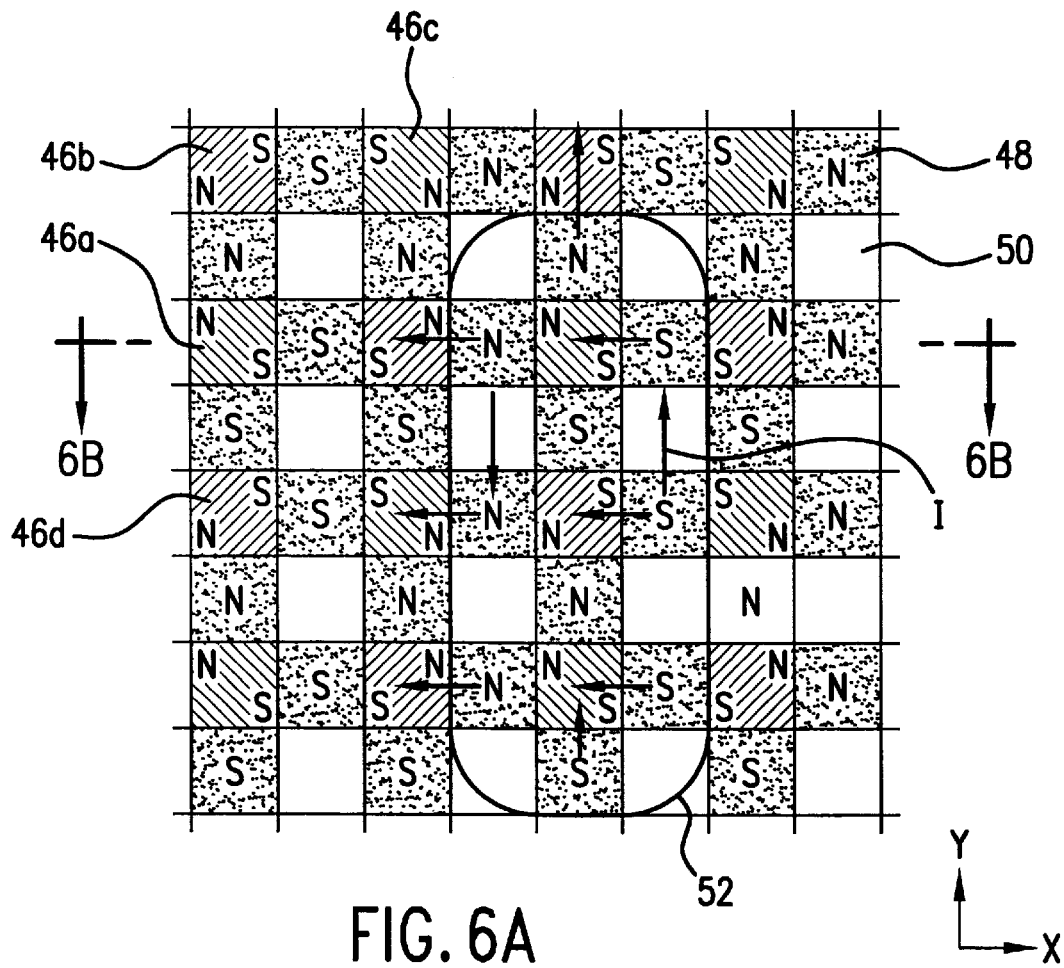
FIGS. 6A and 6B show the operation of the planar electromagnetic motor of the second embodiment of the present invention.
Figure 6B:
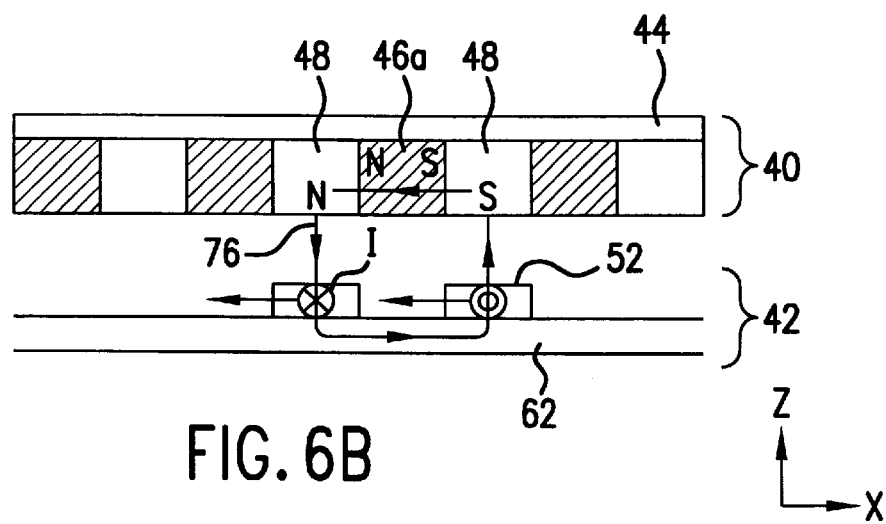

Next, the operation of the electromagnetic motor of the present embodiment is explained referring to FIGS. 6A and 6B. FIG. 6A shows part of the pole unit shown in FIG. 3A and an armature coil 52 for X driving one of the thrust generating units 42. FIG. 6B shows a cross sectional view of FIG. 6A cut along line B—B. In FIGS. 6A and 6B, the yokes 48, which are adjacent to each other in the Y direction, are positioned by a specified space above the area of the coils of the armature coil 52 for X driving. In particular, by the arrangement of the permanent magnets 46a–46d, three yokes 48 located below the left side of the coil 52 in FIG. 6A and that are adjacent to each other in the Y direction are magnetized into N poles, and three yokes 48 located below the right side of the coil 52 in FIG. 6A are magnetized into S poles. In this condition, the magnetic flux loop 76 is formed as shown in FIG. 6B. In other words, it is a closed magnetic circuit that goes from a permanent magnet 46a, through the yokes 48 magnetized into N poles, passes through the coils that extend in the Y direction at the left side of FIGS. 6A and 6B, reaches the core 62, passes through the core 62, passes through the coils that extend in the Y direction at the right side of FIGS. 6A and 6B, and returns to the permanent magnet 46a via the yoke 48 magnetized into S poles. When a specified current I is supplied counter-clockwise in FIG. 6A from a power supply, which is not shown in the figure, to the armature coil 52, a Lorentz's force is generated that tries to shift the coils that are aligned in the Y direction of the armature coil 52 toward the left direction of the figure (the X-direction).

When the thrust generating unit 42 is anchored at a specified position, the pole unit 40, which is supported movably by a supporting mechanism, is shifted in the +X direction by using the reaction to the Lorentz's force as a thrust. It is possible to reverse the shifting direction of the pole unit 40 if the direction of the current that flows to the armature coil 52 is reversed. By doing this, a planar type electromagnetic motor is composed with the thrust generating unit 42 as the stationary part and the pole unit 40 as the moving part. It is of course possible to use the thrust generating unit 42 as the moving part and the pole unit 40 as the stationary part.

Additionally, the drive in the X direction is explained above, but it is also possible to drive in the Y direction in the same way. As shown in FIGS. 3A and 3B, a movable electromagnetic motor that is two dimensionally movable can be realized by preparing a plurality of armature coils and simultaneously driving in the X and Y directions. Additionally, as shown in FIGS. 3A and 3B, since each X drive and Y drive coil are arranged in a crossed arrangement, the driving force per unit surface area can be improved. Also, since the X driving force and the Y driving force are applied at the same point, no rotating force occurs and control can be done easily.

Additionally, since the crossed armature coils (armature coil 52 as the coil for X drive and armature coil 54 as the coil for Y drive) are one unit, and since the units 60a and 60b of the armature coils 52 and 54 that are shifted by P/2 are alternately arranged, a smooth thrust can be realized as explained in FIGS. 2C and 2D.

Additionally, as shown in FIG. 6A, for example, when driving in the X direction, if only one armature coil 52 is used, a small Lorentz's force is generated that shifts the coils of the aforementioned armature coil 52 that extends in the X direction in the Y direction. Therefore, the Lorentz's force in the Y direction, which operates on the entire X drive coil, is canceled by supplying a current that generates a Lorentz's force in the −Y direction to the other armature coil 52.

As explained above, according to the planar electromagnetic motor of the present embodiment, since permanent magnets are arranged so that polarizing directions are opposed at the front, rear, left and right, and magnetic yokes that form magnetic circuits are arranged between the permanent magnets, a high magnetic flux density can be generated in the magnetic circuit formed between the pole unit and the thrust generating unit. At that time, the magnetizing direction of the planar motor, for example, is polarized at 45° with respect to the X axis and the Y axis in the X-Y plane. Because of this, since the yokes adjacent to the front, rear, left and right of the permanent magnets are each magnetized to have poles, the magnetic flux of the permanent magnets can be effectively used for the generation of electromagnetic force.

Additionally, the flat electromagnetic motor of the present embodiment is structured such that permanent magnets are arranged that have a magnetizing direction at a right angle with respect to the axis of the armature coil. Magnetic yokes are arranged between the permanent magnets. Magnetic circuits are formed that supply magnetic flux from the yokes to the armature coils. Therefore, the demagnetizing field by the armature coil does not function directly on the permanent magnets. Additionally, burning of the permanent magnets can be prevented.

Further, according to the planar electromagnetic motor of the present embodiment, since each coil for X drive and each coil for Y drive are provided in a crossed arrangement, the plane drive force per unit surface area can be improved. Additionally, since the X drive and the Y drive function (are applied) at the same point, the control can be done easily because rotation does not occur.

Additionally, since the electromagnetic motor of the present embodiment is electronically driven, it has advantages such that high speed is easy to obtain compared to the pulse motor method of the variable period resistance drive, and the controllability is better than the inductive motor method of the electromagnetic inductive drive.

The present invention is not limited by the above-described embodiments. Various modifications are possible.

Figure 7A:
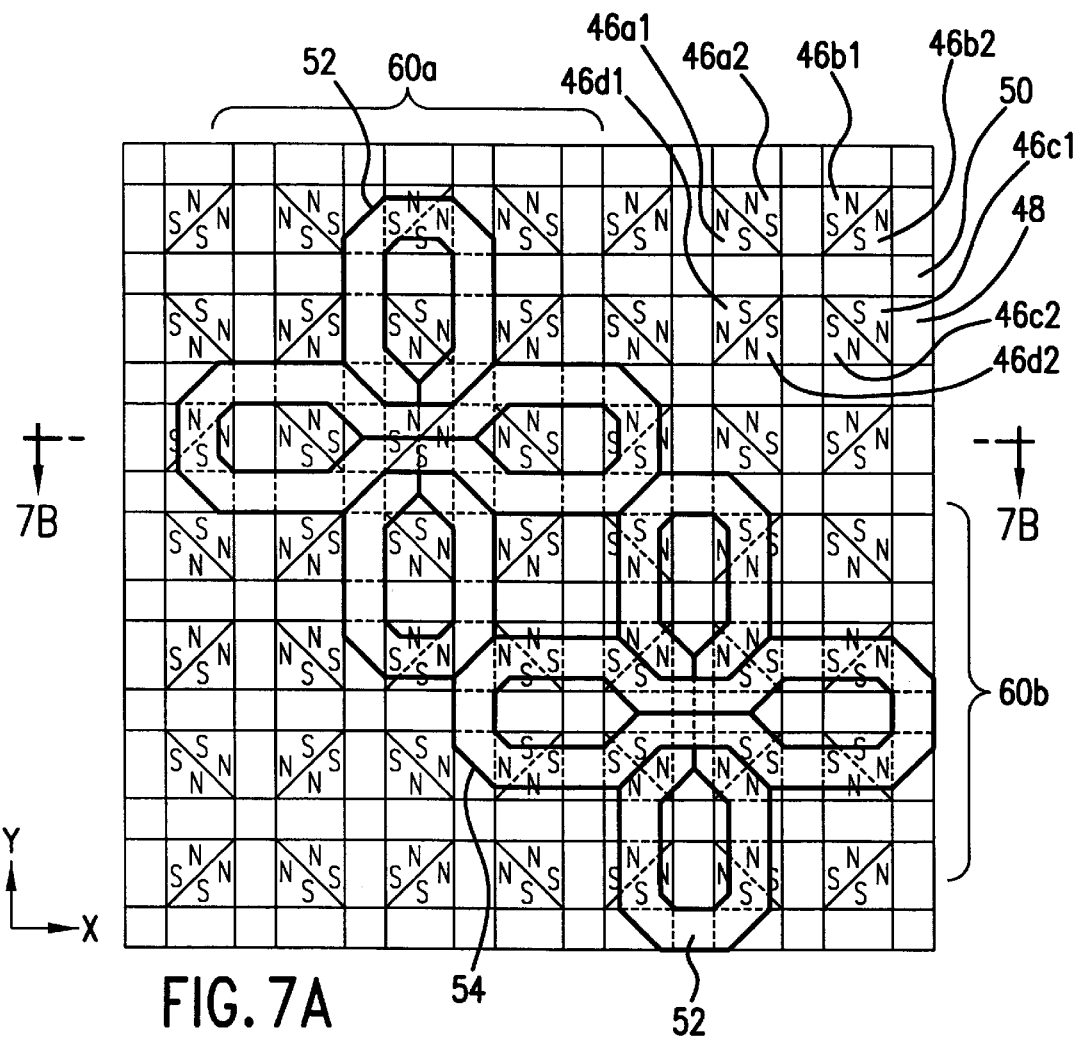
FIGS. 7A–7C show another structure of a planar electromagnetic motor of the second embodiment of the present invention.
Figure 7B:
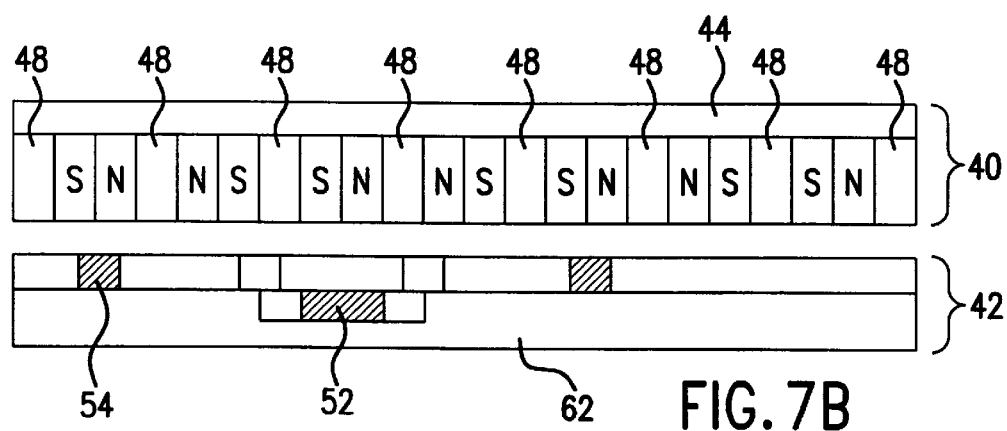
Figure 7C:
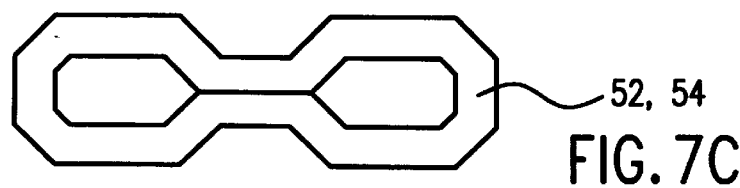

For example, it is possible to have the structure shown in FIGS. 7A–7C, which show a planar motor, for the electromagnetic motor according to the above-mentioned second embodiment. FIG. 7A is a plan view in which a planar electromagnetic motor as a modified example of the second embodiment is viewed through the back surface. FIG. 7B is a cross sectional view along line B—B of FIG. 7A. FIG. 7C shows a shape of one axis of the armature coil, which is different from the square shaped armature coil explained in FIGS. 2A and 2B and the rectangular armature coil explained in FIGS. 3A and 3B. The same symbols are used to identify structural elements that have the same function and effect as in the second embodiment. The different characteristic of this embodiment is that the individual shape of the permanent magnets of the pole unit 40 is a triangular post. In other words, for the permanent magnets of the present modified example, each of the cubic shaped permanent magnets 46a–46d of the second embodiment are switched to a combination of permanent magnets 46x1 and 46x2 (x=a–d) of two triangle poles that are cut along the diagonal corner lines in the pole direction.

With this kind of structure of the electromagnetic motor, the technical problems solved by the electromagnetic motor of the second embodiment also are solved.

Additionally, in this embodiment, a plurality of armature coils are arranged being relatively shifted by P/2. However, the present invention is not limited to this arrangement. It is also acceptable to have a plurality of armature coils for X driving that are arranged so as to be relatively shifted by 1/n (n is an integer of 2 or more) of the pitch P in the X direction, and armature coils for Y driving that are arranged so as to be relatively shifted by 1/n (n is an integer of 2 or more) of the pitch P in the Y direction for the structure of the thrust generating unit. By doing this, the smoothness of the thrust can be further improved.

Figure 8:
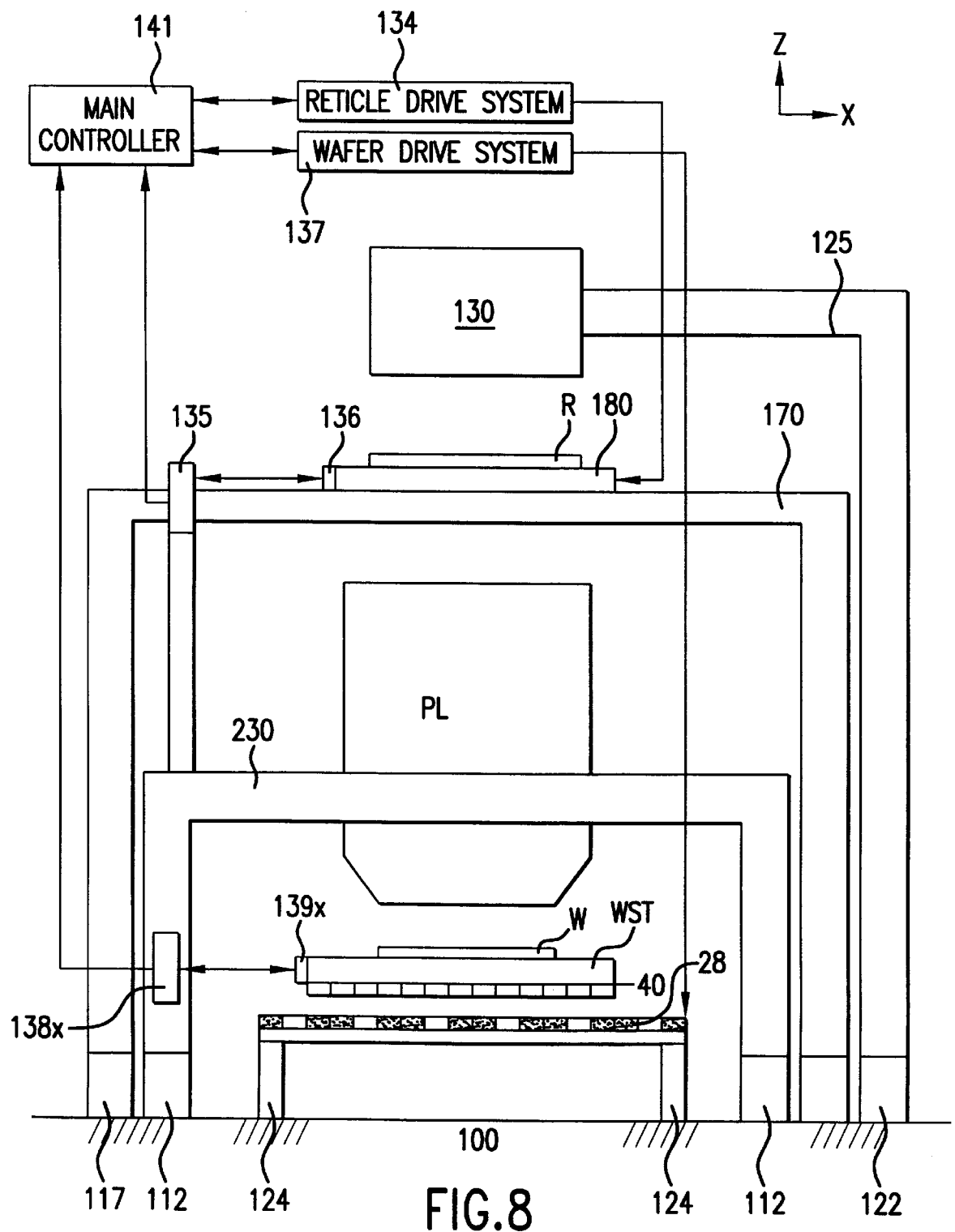
FIG. 8 shows the structure in which the planar electromagnetic motor of the second embodiment of the present invention is adopted in an exposure device.

FIG. 8 shows a schematic structure of an exposure device that adopts the linear motor explained in FIGS. 1A and 1B as a planar motor, which is explained in FIGS. 2A–2D. The exposure device of the present embodiment is a projection exposure device of the so-called step-and-scan type, in which a reticle (mask) is one-dimensionally scanned and a wafer (substrate) is one dimensionally scanned at a speed that is synchronized with the reticle scanning speed based on the magnification amount of the projection optical system. As is known, the projection exposure device can be used to manufacture many products such as, for example, ICs, LCDs, other flat panel displays and other thin film devices. In FIG. 8, a first column 230, made of Inver [trademark] (a metal alloy with a low expansion ratio) is mounted on a base 100 via a vibration control damper 112. A projection optical system PL is affixed to the column 230. Also, on the first column 230, a reticle scanning stage 180 is arranged that uses the linear motor explained in FIGS. 1A and 1B. A laser interferometer 135 is provided to measure the position of the reticle scanning stage 180. A second column 170 is provided to hold the reticle scanning stage 180. A third column 125, mounted on base 100 by a vibration control damper 122, holds an illumination optical system 130.

A stage device is provided that is separated from the first column 230, and in which the planar motor explained in FIGS. 2A–2D is used. This stage device is composed of a stage driving unit, which corresponds to the thrust generating unit 28 of FIG. 2, and a wafer stage WST on which a pole unit 40 is provided. Wafer W is loaded on the wafer stage, and is a photosensitive substrate. On the side of the wafer stage WST opposite the side on which the wafer W is loaded, a plurality of permanent magnets, each of which have poles facing in a specified direction, and magnetic yokes are arranged. The stage driving unit is anchored to the base 100 via a frame 124.

When the thrust generating unit 28 is excited, the wafer stage WST positions the wafer W in the direction that is perpendicular to the surface of the paper (Y direction) in FIG. 8 in the plane (horizontal plane) perpendicular to the optical axis of the projection optical system PL, in the X direction perpendicular to the Y axis in the horizontal plane, and in the Z direction, which is the optical axis direction of the projection optical system PL in response to the excitation. Also, the inclination of the wafer W with respect to the image forming surface of the projection optical system PL can be adjusted. A reverse reaction in the direction opposite to the shifting direction occurs in the stage driving unit by shifting the wafer stage WST in the X, Y and θ directions (the θ direction being rotation about the Z-axis). This reaction is transferred to the base 100 via the frame 124. Meanwhile, since the projection optical system PL is held by the first column 230 via the vibration control damper 112, there is no case in which the reaction that occurs in the stage generating unit vibrates the projection optical system PL.

A second column 170 made of Inver [trademark] is anchored on the base 100 via a vibration control damper 117. The reticle scanning stage 180, which freely slides in the X direction, is installed on the top of the second column 170, and the reticle R, in which the pattern for transfer is formed, is held on the reticle scanning stage 180. The reticle scanning stage 180, specifically, is a stage of the driving method in which the stationary part and the moving part that are described in Japanese Laid-Open Patent Application No. 8-63231 relatively shift, and has a structure that damps the reaction of the driving. Accordingly, the reaction that occurs in the reticle scanning stage 180 and the reaction that occurs in the stage driving unit do not vibrate the projection optical system PL, and also do not vibrate the illumination optical system 130.

Meanwhile, the illumination light for exposure is supplied from, e.g., an excimer laser source (KrF, ArF) or from a solid-state laser source (not shown in the figure) and passes through a light conducting optical system (not shown in figure), and is incident upon the illumination optical system 130. The illumination optical system 130 has a blind mechanism, a fly eye lens, a condenser lens and the like, and forms the illumination light in a specified area to irradiate the reticle R. Thus, the reticle R, which receives the illumination light that is regulated to a specified shape, is held by the reticle scanning stage 180, which can uniformly shift in at least the X direction on the second column 170. The reticle scanning stage 180 performs one-dimensional scanning by shifting in the X direction and very small rotation shifting for yaw correction or the like by the reticle driving system 134. Additionally, a movable mirror 136, which reflects a distance measuring beam from the laser interferometer 135, is attached at one end of the reticle scanning stage 180, and the X direction position of the reticle R is measured in real time by the laser interferometer 135.

The image of the pattern formed on a reticle R is reduced, for example, by ¼, and image formed on the wafer W by the projection optical system PL. The wafer W is loaded on the wafer stage WST, which is movable in the X, Y and Z directions.

When exposing, by driving the reticle scanning stage 180, the reticle R is scanned with a constant speed V1 in the X direction, which is perpendicular to the longer side direction of the illumination area. By driving the wafer stage WST in synchronization to the reticle driving speed, the wafer W is scanned with a constant speed V2 in the −X direction with respect to the reticle image in the illumination area. When the projection magnification to the wafer W from the reticle R by the projection optical system PL is β, the speed V2=β×V1. Driving of the wafer stage WST is controlled by the wafer drive system 137. Thus, by scanning the reticle R and the wafer W in synchronization, the entire image pattern of the reticle R is projected and exposed on the wafer W. When exposure of one exposure area is completed, the scanning start position of the next exposure area on the wafer W is shifted to the exposure field of the projection optical system PL by driving the wafer stage WST by the stage driving unit.

Additionally, a shifting mirror 139X, which reflects a distance measuring beam from a laser interferometer 138X, is attached at one end surface in the X direction of the wafer stage WST, and the coordinate position of the wafer stage WST in the X direction is measured in real time by the laser interferometer 138X. Another movable mirror (not shown in the figure), which reflects a distance measuring beam from another laser interferometer (not shown) is attached at one end surface in the Y direction of the wafer stage WST and the coordinate position of the wafer stage WST in the Y direction is measured in real time by that laser interferometer.

Additionally, the control of the exposure operation by the present scanning exposure device is universally controlled by the main controller 141. The basic operation of the main controller 141 is to maintain a specified speed ratio (a value which corresponds to the projection magnification of the projection optical system PL) of the reticle scanning stage 180 and of the wafer stage WST when performing scanning exposure, and to relatively shift the reticle scanning stage 180 and the wafer stage WST while holding the relative positional relation of the reticle pattern and the wafer pattern within a specified alignment error range, based on position information from the laser interferometers 135 and 138 and the speed information from the driving systems 134, 137 and the like.

As described above, according to embodiments of the present invention, a high magnetic flux density can be generated without making the permanent magnets large, and high thrust and high efficiency of the electromagnetic motor can also be realized.

Additionally, according to embodiments of the present invention, the demagnetization field of the armature coils does not affect the permanent magnets of the electromagnetic motor, and burning of the permanent magnets can be prevented.

Further, according to embodiments of the present invention, the driving force per unit surface area of a planar electromagnetic motor can be made large, and unnecessary rotating force will not be transferred to the moving part.

While the present invention has been described with reference to preferred embodiments thereof, it is to be understood that the invention is not limited to the disclosed embodiments or constructions. To the contrary, the invention is intended to cover various modifications and equivalent arrangements. In addition, while the various elements of the disclosed invention are shown in various combinations and configurations, which are exemplary, other combinations and configurations, including more, less or only a single element, are also within the spirit and scope of the invention.

What is claimed is:

1. A stage device having a moving part on which an object is loaded, and a stationary part, wherein:
   a pole unit is included in one of the moving part and the stationary part, the pole unit having a plurality of magnets in which same poles of adjacent ones of the magnets are opposed and a plurality of yokes are interposed between the plurality of magnets; and
   a thrust generator is included in the other of the moving part and the stationary part, the thrust generator having a plurality of armature coils opposed to and spaced from the pole unit and a magnetic core that anchors the plurality of armature coils.

2. The stage device of claim 1, wherein the plurality of magnets are aligned in one direction with a specified pitch P, and the yokes are aligned with the specified pitch P; and
   the plurality of armature coils are relatively shifted by 1/n of the pitch P, n being an integer of at least 2 or more, and are arranged on the magnetic cores.

3. The stage device of claim 1, wherein the armature coils have hollow centers.

4. The stage device of claim 1, wherein the plurality of magnets are a plurality of permanent magnets.

5. An exposure device that exposes a pattern image on a mask onto a substrate, comprising the stage device of claim 1 for loading the substrate.

6. The stage device of claim 1, wherein the moving part is moved by a Lorentz force.

7. An electromagnetic motor comprising:
   a pole unit having a plurality of magnets in which same poles of adjacent ones of the magnets are opposed and are aligned in X and Y directions with a specified pitch P, the X and Y directions being orthogonal, and a plurality of yokes interposed in the X and Y directions between the plurality of magnets; and
   a thrust generator having a plurality of armature coils opposed to and spaced from the pole unit, and surrounded by a space equal to the pitch P, and a magnetic core that anchors the plurality of armature coils in the X and Y directions.

8. The electromagnetic motor of claim 7, wherein the plurality of magnets are arranged so that a magnetic axis of each magnet is inclined at approximately 45° with respect to the X and Y directions.

9. The electromagnetic motor of claim 7, wherein a non-magnetic, non-conductive member is interposed in an area that is surrounded by the plurality of yokes.

10. The electromagnetic motor of claim 7, further comprising second magnets provided on back surfaces of the plurality of yokes opposite a surface of the yokes that oppose the armature coil, the second magnets having magnetic axes extending in a Z direction, which is orthogonal to the X and Y directions, with the poles facing the yokes that are magnetized by the first magnets.

11. The electromagnetic motor of claim 7, wherein the thrust generator has a plurality of the armature coils for X direction driving arranged so as to be relatively shifted by 1/n, n being an integer of 2 or more, of the pitch P in the X direction, and a plurality of the armature coils for Y direction driving arranged so as to be relatively shifted by 1/n of the pitch P in the Y direction.

12. The electromagnetic motor of claim 11, wherein the armature coils for the X direction driving and the armature coils for the Y direction driving cross each other and are arranged in an X-Y plane.

13. The electromagnetic motor of claim 12, wherein the armature coils have hollow centers.

14. The electromagnetic motor of claim 7, wherein the plurality of magnets are a plurality of permanent magnets.

15. A stage device having a moving part on which an object is loaded, and a stationary part, wherein the pole unit of claim 7 is included in one of the moving part and the stationary part, and the thrust generator of claim 7 is included in the other of the moving part and the stationary part.

16. An exposure device that exposes a pattern image on a mask onto a substrate, comprising the stage device of claim 15 loading the substrate.

17. The electromagnetic motor of claim 7, wherein the electromagnetic motor generates a Lorentz force.

18. An electromagnetic motor comprising:
   a pole unit having a plurality of pairs of magnets, each pair of magnets having a first magnet and a second magnet, the first magnet having poles that are opposed to same poles of the second magnet, the poles of each pair of magnets being opposed to same poles of the adjacent pair of magnets, the pairs of magnets being aligned in X and Y directions with a pitch P, the X and Y directions being orthogonal, and a plurality of yokes that are interposed in the X and Y directions between the plurality of pairs of magnets; and
   a thrust generator having a plurality of armature coils opposed in parallel to and spaced from the pole unit, and surrounded by a space equal to the pitch P, and a magnetic core that anchors the plurality of armature coils in the X and Y directions.

19. The electromagnetic motor of claim 18, wherein the first and second magnets are permanent magnets.

20. The electromagnetic motor of claim 18, wherein the electromagnetic motor generates a Lorentz force.

21. A method of making a stage device that incorporates an electromagnetic motor made by forming a pole unit by providing a plurality of magnets in which same poles of adjacent magnets are opposed, and interposing a plurality of yokes between the plurality of magnets; and spacing a thrust generator from the pole unit, the thrust generator having a plurality of armature coils opposed to and spaced from the pole unit and a magnetic core that anchors the plurality of armature coils, the method including the steps of:
   providing a moving part on which an object is loaded; and
   providing a stationary part;
   wherein the pole unit is included in one of the moving part and the stationary part, and the thrust generator is included in the other of the moving part and the stationary part.

22. The method of claim 21, further comprising aligning the plurality of magnets in one direction with a specified pitch P, and aligning the yokes with the specified pitch P; and
   relatively shifting the plurality of armature coils by 1/n of the pitch P, n being an integer of at least 2 or more, and arranging the plurality of armature coils on the magnetic cores.

23. The method of claim 21, wherein the electromagnetic motor generates a Lorentz force.

24. A method of making an exposure device that exposes a pattern image on a mask onto a substrate, the exposure device including a stage device for loading the substrate, the stage device incorporating an electromagnetic motor made by forming a pole unit by providing a plurality of magnets in which same poles of adjacent magnets are opposed, and interposing a plurality of yokes between the plurality of magnets; and spacing a thrust generator from the pole unit, the thrust generator having a plurality of armature coils opposed to and spaced from the pole unit and a magnetic core that anchors the plurality of armature coils, the method including the steps of:

providing a projection system that projects the pattern image on the mask onto the substrate;

providing a moving part on which the substrate is loaded; and providing a stationary part;

wherein the pole unit is included in one of the moving part and the stationary part, and the thrust generator is included in the other of the moving part and the stationary part.

25. The method of claim 24, wherein the electromagnetic motor generates a Lorentz force.

26. A method of making an electromagnetic motor comprising:

forming a pole unit by providing a plurality of magnets in which same poles of adjacent ones of the magnets are opposed and are aligned in X and Y directions with a specified pitch P, the X and Y directions being orthogonal, and interposing a plurality of yokes between the plurality of magnets in the X and Y directions; and spacing a thrust generator having a plurality of armature coils opposed to and spaced from the pole unit, and surrounded by a space equal to the pitch P, and a magnetic core that anchors the plurality of armature coils in the X and Y directions.

27. The method of claim 26, further comprising arranging the plurality of magnets so that a magnetic axis of each magnet is inclined at approximately 45° with respect to the X and Y directions.

28. The method of claim 26, further comprising interposing a non-magnetic, non-conductive member in an area that is surrounded by the plurality of yokes.

29. The method of claim 26, further comprising providing second magnets on back surfaces of the plurality of yokes opposite a surface of the yokes that oppose the armature coil, the second magnets having magnetic axes extending in a Z direction, which is orthogonal to the X and Y directions, with the poles facing the yokes that are magnetized by the first magnets.

30. The method of claim 26, wherein the thrust generator has a plurality of the armature coils for X direction driving arranged so as to be relatively shifted by 1/n, n being an integer of 2 or more, of the pitch P in the X direction, and a plurality of the armature coils for Y direction driving arranged so as to be relatively shifted by 1/n of the pitch P in the Y direction.

31. The method of claim 20, wherein the armature coils for the X direction driving and the armature coils for the Y direction driving cross each other and are arranged in an X-Y plane.

32. The method of claim 26, wherein the electromagnetic motor generates a Lorentz force.

33. A method of making an electromagnetic motor comprising:

forming a pole unit by providing a plurality of pairs of magnets, each pair of magnets having a first magnet and a second magnet, opposing poles of the first magnet to same poles of the second magnet, opposing the poles of each pair of magnets to same poles of the adjacent pair of magnets, aligning the pairs of magnets in X and Y directions with a pitch P, the X and Y directions being orthogonal, and interposing a plurality of yokes in the X and Y directions between the plurality of pairs of magnets; and providing a thrust generator having a plurality of armature coils opposed in parallel to and spaced from the pole unit, and surrounded by a space equal to the pitch P, and a magnetic core that anchors the plurality of armature coils in the X and Y directions.

34. The method of claim 33, wherein the electromagnetic motor generates a Lorentz force.

* * * * *